(12) United States Patent
Goyal

(10) Patent No.: US 6,740,421 B1
(45) Date of Patent: May 25, 2004

(54) ROLLING PROCESS FOR PRODUCING BIAXIALLY TEXTURED SUBSTRATES

(75) Inventor: Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/620,251

(22) Filed: Jul. 14, 2003

(51) Int. Cl.[7] .......................... B32B 15/00; B32B 15/01
(52) U.S. Cl. .................... 428/469; 428/615; 428/457; 428/702; 148/516; 148/527; 148/537; 505/330
(58) Field of Search .................... 428/457, 469, 428/702, 615; 148/516, 527, 537; 505/330

(56) References Cited

U.S. PATENT DOCUMENTS

| | | |
|---|---|---|
| 5,739,086 A | 4/1998 | Goyal et al. |
| 5,741,377 A | 4/1998 | Goyal et al. |
| 5,846,912 A | 12/1998 | Goyal et al. |
| 5,898,020 A | 4/1999 | Goyal et al. |
| 5,958,599 A | 9/1999 | Goyal et al. |
| 5,964,966 A | 10/1999 | Goyal et al. |
| 5,968,877 A | 10/1999 | Budai et al. |
| 6,077,344 A | 6/2000 | Beach et al. |
| 6,106,615 A | 8/2000 | Goyal et al. |
| 6,114,287 A | 9/2000 | Goyal et al. |
| 6,150,034 A | 11/2000 | Goyal et al. |
| 6,156,376 A | 12/2000 | Goyal et al. |
| 6,159,610 A | 12/2000 | Goyal et al. |
| 6,180,570 B1 | 1/2001 | Goyal |
| 6,235,402 B1 | 5/2001 | Beach et al. |
| 6,256,521 B1 | 7/2001 | Goyal et al. |
| 6,261,704 B1 | 7/2001 | Goyal et al. |
| 6,270,908 B1 | 8/2001 | Feenstra et al. |
| 6,316,391 B1 | 11/2001 | Doi et al. |
| 6,331,199 B1 | 12/2001 | Goyal et al. |
| 6,375,768 B1 | 4/2002 | Goyal |
| 6,399,154 B1 | 6/2002 | Feenstra et al. |
| 6,440,211 B1 | 8/2002 | Beach et al. |
| 6,447,714 B1 | 9/2002 | Goyal et al. |
| 6,451,450 B1 | 9/2002 | Feenstra et al. |
| 6,455,166 B1 | 9/2002 | Truchan et al. |
| 6,468,591 B1 | 10/2002 | Goyal et al. |
| 6,486,100 B1 | 11/2002 | Goyal et al. |

OTHER PUBLICATIONS

G.Hammerl et al "Improving Coated Conductors," Appl. Superc. Conference, Houston, TX, Aug. 4–9, 2002.

G.Hammerl et al "Large Grain Boundary Area Superconductors," Eur.Phys.J. B27, 299–301, 2002.

G. Hammerl et al "Possible Solution of the Grain Boundary Problem for Applications of High Tc Superconductors," Appl. Phys. Ltrs., V.81, #17, Oct. 21, 2002.

*Primary Examiner*—Stephen Stein
(74) *Attorney, Agent, or Firm*—Joseph A. Marasco

(57) ABSTRACT

A method of preparing a biaxially textured article includes the steps of: rolling a metal preform while applying shear force thereto to form as-rolled biaxially textured substrate having an a rotated cube texture wherein a (100) cube face thereof is parallel to a surface of said substrate, and wherein a [100] direction thereof is at an angle of at least 30° relative to the rolling direction; and depositing onto the surface of the biaxially textured substrate at least one epitaxial layer of another material to form a biaxially textured article.

41 Claims, 14 Drawing Sheets

18.00 µm = 30 steps 373 Grains

ROLLING PROCESS FOR PRODUCING BIAXIALLY TEXTURED SUBSTRATES

The United States Government has rights in this invention pursuant to contract no. DE-AC05-00OR22725 between the United States Department of Energy and UT-Battelle, LLC.

FIELD OF THE INVENTION

The present invention relates to processes of making biaxially textured substrates that include rolling steps, and more particularly to such processes wherein shear force is introduced into the process in order to avoid the need for annealing steps to produce a sharp biaxial texture, and other attributes such as fine grain sizes and elongated grains.

BACKGROUND OF THE INVENTION

High critical current density conductors fabricated by epitaxial deposition of high temperature superconductors on biaxially textured substrates is considered to be a viable route towards realizing low cost, high performance superconducting wires for a variety of applications. A well-formed cube texture—a biaxially textured face centered cubic (FCC) crystalline structure—is first developed in a metal (pure metal or metal alloy) substrate (template), followed by epitaxial deposition of intermediate oxide buffer layers and superconductors.

The following U.S. Patents are expressly referenced, and the entire disclosure of each listed patent is expressly incorporated herein by reference:

U.S. Pat. No. 6,486,100 issued on Nov. 26, 2002 to Goyal, et al., entitled Method for Preparing Preferentially Oriented, High Temperature Superconductors using Solution Reagents.

U.S. Pat. No. 6,468,591 issued on Oct. 22, 2002 to Goyal, et al., entitled Method For Making MgO Buffer Layers on Rolled Nickel or Copper as Superconductor Substrates.

U.S. Pat. No. 6,451,450 issued on Sep. 17, 2002 to Feenstra, et al., entitled Method of Depositing a Protective Layer Over a Biaxially Textured Alloy Substrate and Composition Therefrom.

U.S. Pat. No. 6,447,714 issued on Sep. 10, 2002 to Goyal, et al., entitled Method for Forming Biaxially Textured Articles by Powder Metallurgy.

U.S. Pat. No. 6,440,211 issued on Aug. 27, 2002 to Beach, et al., entitled Method of Depositing Buffer Layers on Biaxially Textured Metal Substrates.

U.S. Pat. No. 6,399,154 issued on Jun. 4, 2002 to Feenstra, et al., entitled Laminate Article.

U.S. Pat. No. 6,375,768 issued on Apr. 23, 2002 to Goyal, entitled Method for Making Biaxially Textured Articles by Plastic Deformation.

U.S. Pat. No. 6,331,199 issued on Dec. 18, 2001 to Goyal, et al., entitled Biaxially Textured Articles formed by Powder Metallurgy.

U.S. Pat. No. 6,270,908 issued on Aug. 7, 2001 to Feenstra, et al., entitled Rare Earth Zirconium Oxide Buffer Layers on Metal Substrates.

U.S. Pat. No. 6,261,704 issued on Jul. 17, 2001 to Goyal, et al., entitled MgO Buffer Layers on Rolled Nickel or Copper as Superconductor Substrates.

U.S. Pat. No. 6,256,521 issued on Jul. 3, 2001 to Goyal, et al., entitled Preferentially Oriented, High Temperature Superconductors by Seeding and a Method for their Preparation.

U.S. Pat. No. 6,235,402 issued on May 22, 2001 to Beach, et al., entitled Buffer Layers on Biaxially Textured Metal Substrates.

U.S. Pat. No. 6,180,570 issued on Jan. 30, 2001 to Goyal, entitled Biaxially Textured Articles formed by Plastic Deformation.

U.S. Pat. No. 6,159,610 issued on Dec. 12, 2000 to Goyal, et al., entitled Buffer Layers on Metal Surfaces having Biaxial Texture as Superconductor Substrates.

U.S. Pat. No. 6,156,376 issued. on Dec. 5, 2000 to Goyal, et al., entitled Buffer Layers on Metal Surfaces having Biaxial Texture as Superconductor Substrates.

U.S. Pat. No. 6,150,034 issued on Nov. 21, 2000 to Goyal, et al., entitled Buffer Layers on Rolled Nickel or Copper as Superconductor Substrates.

U.S. Pat. No. 6,114,287 issued on Sep. 5, 2000 to Goyal, et al., entitled Method of Deforming a Biaxially Textured Buffer Layer on a Textured Metallic Substrate and Articles Therefrom.

U.S. Pat. No. 6,106,615 issued on Aug. 22, 2000 to Goyal, et al., entitled Method of Forming Biaxially Textured Alloy Substrates and Devices Thereon.

U.S. Pat. No. 6,077,344 issued on Jun. 20, 2000 to Beach, et al., entitled Sol-Gel Deposition of Buffer Layers on Biaxially Textured Metal Substances.

U.S. Pat. No. 5,968,877 issued on Oct. 19, 1999 to Budai, et al., entitled High Tc YBCO Superconductor Deposited on Biaxially Textured Ni Substrate.

U.S. Pat. No. 5,964,966 issued on Oct. 12, 1999 to Goyal, et al., entitled Method of Forming Biaxially Textured Alloy Substrates and Devices Thereon.

U.S. Pat. No. 5,958,599 issued on Sep. 28, 1999 to Goyal, et al., entitled Structures Having Enhanced Biaxial Texture.

U.S. Pat. No. 5,898,020 issued on Apr. 27, 1999 to Goyal, et al., entitled Structures Having Enhanced Biaxial Texture and Method of Fabricating Same.

U.S. Pat. No. 5,846,912 issued on Dec. 8, 1998 to Goyal, et al., entitled Method for Preparation of Textured YBa2Cu3Ox Superconductor.

U.S. Pat. No. 5,741,377 issued on Apr. 21, 1998 to Goyal, et al., entitled Structures Having Enhanced Biaxial Texture and Method of Fabricating Same.

U.S. Pat. No. 5,739,086 issued on Apr. 14, 1998 to Goyal, et al., entitled Structures Having Enhanced Biaxial Texture and Method of Fabricating Same.

U.S. patent application Ser. No. 09/406,190 filed on Sep. 27, 1999 by Norton, et al., entitled Buffer Architecture for Biaxially Textured Structures and Method of Fabricating Same.

In the above-taught processes of making biaxially textured substrates, typically a cube texture is formed by rolling and subsequently annealing a metallic preform, usually a metal strip. The as-rolled metal or alloy strip has a rolling texture, which is a complex mixed texture. Annealing of the metal strip is required to form a recrystallization texture, which for FCC metals is the cube texture. High annealing temperatures are generally required in order to form the desired completely cubic texture. Moreover, the resulting grain sizes are also large; the dimensions thereof often approach the thickness of the thin strip. For example, a 50 $\mu$m thick substrate, upon complete annealing may often result in a substrate with an average grain size of 50 $\mu$m. Furthermore, the grains in a cube-textured strip are generally equiaxed, which is typical of the recrystallization process. A fully annealed, cube textured strip is generally mechanically much softer and weaker compared to the as-rolled strip.

For some applications, it is essential that a fully developed cube texture be formed. For many FCC metals and alloys however, this may require a very high annealing temperature. In some cases upon annealing at high temperatures results in secondary recrystallization of the material and even the previously formed cube texture at lower temperatures is destroyed.

There may be some fundamental limitations towards the fabrication of high-$J_c$ conductors on such templates. One such limitation may be caused by large grain sizes in the substrates with respect to finite width of the substrates, a phenomenon known as percolative pinch-off. The number of grains that exist across the width of a substrate tape is somewhat proportional to the ability of epitaxial superconductors to carry current ($J_c$), to a point.

Reductions in $J_c$ due to the finite width of the substrate become a less significant negative factor for substrates having a width of at least 100 grains. Hence, for substrates that are at least 0.5 cm (100 grains) wide and have a typical average grain size of no more than 50 μm, the percolative pinch-off of $J_c$ due to a large grain size in the substrate and a finite width of the substrate is less of an issue.

However, for many large-scale applications of superconducting materials, substrate widths of 0.4 cm and even less are required. In these cases, the percolative pinch-off of $J_c$ due to a large grain size in the substrate and a finite width of the substrate is a significant issue.

OBJECTS OF THE INVENTION

Accordingly, objects of the present invention include the provision of new methods of making biaxially textured substrates wherein post-rolling heating steps can be reduced or eliminated. The invention provides a method of making substrates with fine grain sizes and/or elongated grains. The invention also provides a method of making textured substrates that are harder and/or stronger than annealed substrates. The invention provides a method of making a biaxially textured substrate with a new kind of biaxial texture. Further and other objects of the present invention will become apparent from the description contained herein.

SUMMARY OF THE INVENTION

In accordance with one aspect of the present invention, the foregoing and other objects are achieved by a biaxially textured article that includes a directionally rolled, biaxially textured metallic substrate having an as-rolled, rotated cube texture wherein a (100) cube face thereof is parallel to a surface of said article, and wherein a [100] direction thereof is at an angle of at least 10° relative to a rolling direction thereof, the substrate having thereon at least one epitaxial layer of another material.

In accordance with another aspect of the present invention, a method of preparing a biaxially textured article includes the steps of: rolling a metal preform while applying shear force thereto to form as-rolled biaxially textured substrate having an a rotated cube texture wherein a (100) cube face thereof is parallel to a surface of said substrate, and wherein a [100] direction thereof is at an angle of at least 10° relative to a rolling direction; and depositing onto the surface of the biaxially textured substrate at least one epitaxial layer of another material to form a biaxially textured article.

For a better understanding of the present invention, together with other and further objects, advantages and capabilities thereof, reference is made to the following disclosure and appended claims in connection with the above-described drawings.

DETAILED DESCRIPTION OF THE INVENTION

By applying shear force during the rolling process, a biaxially textured substrate can be obtained in an as-rolled state without the need for any annealing. The as-rolled texture has adequate, single orientation, biaxial texture. Shear force can be introduced in one or more of a variety of ways. The concept of applying shear force to the preform during the rolling process to obtain an as-rolled uniaxial or biaxial texture (with no annealing being necessary) is critical to the invention; the particular method of applying the shear force is not critical to the invention.

A unique and distinct characteristic of substrates produced in accordance with the present invention is that the textured substrate has a rotated cube texture such that the (100) cube face is parallel to the tape surface and the [100] direction is at an angle of at least 10° relative to the rolling direction. The cube texture is characterized by a {100}<100> orientation which is at an angle of at least 10° relative to an ideal cube texture orientation of {100}<100>. The angle is usually about 45°, but can be any angle of 10° or more, for example, 15°, 20°, 25°, 30°, 35°, or 40°. A substrate with an ideal cube texture orientation of {100}<100> is a substrate wherein the (100) planes of all the grains are perfectly parallel to the tape surface and the [100] directions of all the grains are perfectly aligned along the length of a tape. This corresponds to a [100] direction being aligned with the rolling direction.

Biaxially textured substrates made in accordance with the present invention are preferably characterized by an in-plane texture with a x-ray diffraction phi scan peak of no more than 20° full width at half maximum (FWHM) and also by a out-of-plane texture with a omega scan of no more than 20° FWHM (a characteristic of uniaxial texture). FWHM is defined by a Gaussian fit to a line scan such as a phi-scan or a omega scan.

Another unique and distinct characteristic of substrates produced in accordance with the present invention is that the biaxially textured substrate can have an average grain size of 10 $\mu$m or less. Preferably, the average grain size thereof is not more than 5 $\mu$m, and more preferably not more than 1 $\mu$m. The grains preferably have an aspect ratio of at least 10.

The following methods of applying shear force during the rolling process are set forth as examples. These methods and other methods can be used alone or in combination in order to carry out the present invention.

High Tension

Figure 1:
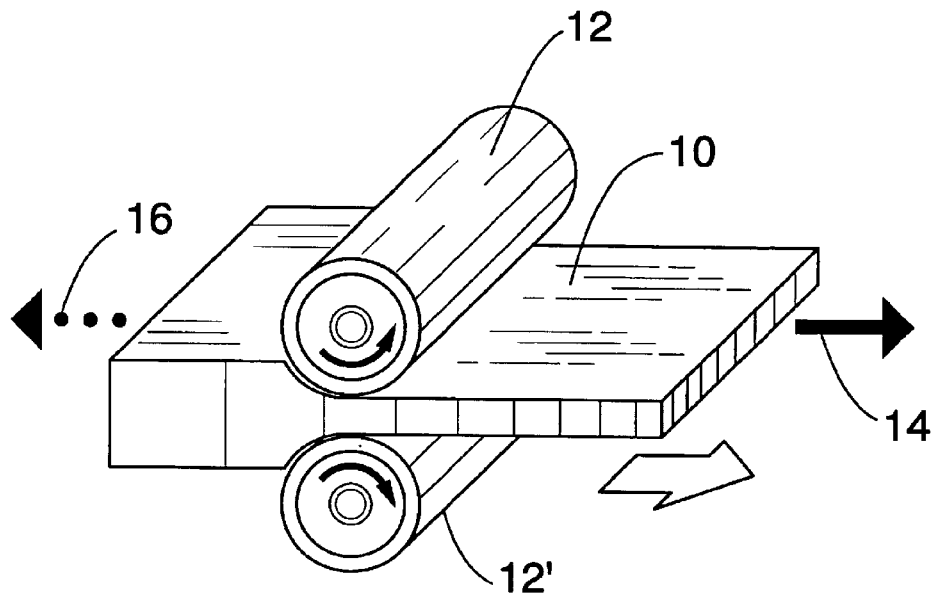
FIG. 1 is a schematic illustration of a high-tension method of applying shear force to produce a biaxially textured article in accordance with the present invention.

As shown in FIG. 1, high tension, or pulling force 14, is applied to a metal strip 10 in front of the rolls 12, 12', resulting in a shear force along the rolling direction, shown by outline arrow. Normal back tension 16 can optionally be applied.

Pulling

Figure 2:
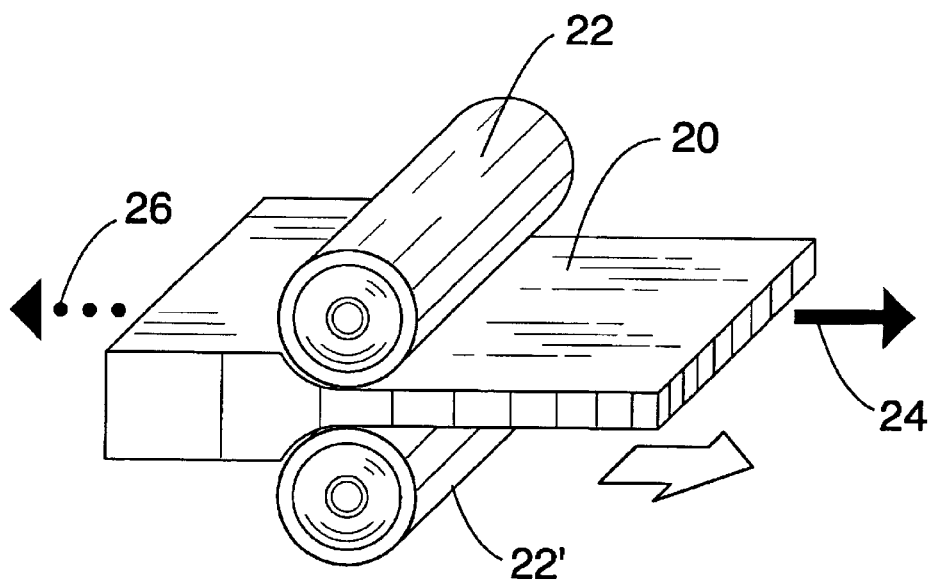
FIG. 2 is a schematic illustration of a pulling method of applying shear force to produce a biaxially textured article in accordance with the present invention.

As shown in FIG. 2, pulling 24 the metal strip 20 through a set of freely rotating, un-powered rolls 22, 22' results in a shear force along the rolling direction, shown by outline arrow. Normal back tension 26 can optionally be applied.

Reduced Lubrication

Application of a reduced amount of lubricant or no lubricant during rolling results in a shear force along the rolling direction.

Incongruent Rolls

Figure 3:
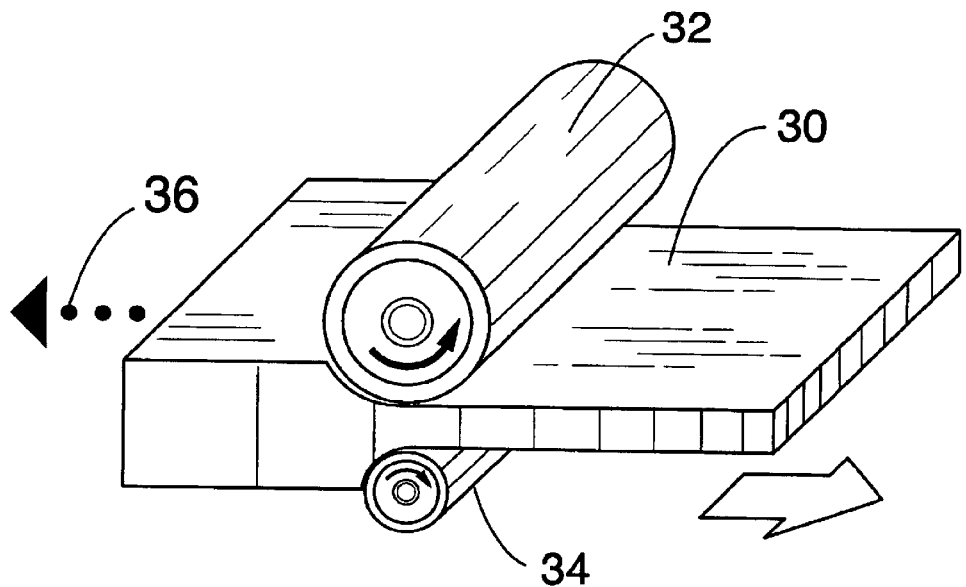
FIG. 3 is a schematic illustration of a method of applying shear force using incongruent rolls to produce a biaxially textured article in accordance with the present invention.

As shown in FIG. 3, using rolls 32, 34 of different diameter so that the circumferential velocities of the work rolls are different results in a shear force applied to the metal strip 30 along the rolling direction, shown by outline arrow. Normal back tension 36 can optionally be applied.

Offset Rolls

Figure 4:
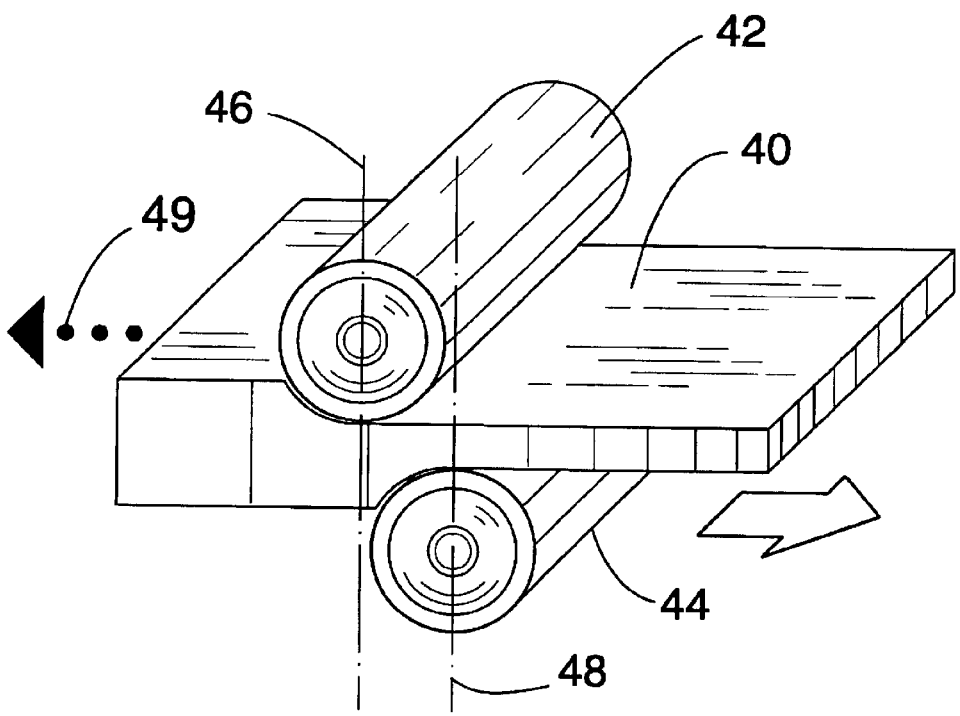
FIG. 4 is a schematic illustration of a method of applying shear force using offset rolls to produce a biaxially textured article in accordance with the present invention.

As shown in FIG. 4, the use of offset rolls 42, 44 (in different vertical planes, 46, 48, respectively), results in a shear force applied to the metal strip 40 along the rolling direction, shown by outline arrow. Normal back tension 49 can optionally be applied.

Altered Preform Composition

Incorporation of rigid particles into a soft ductile metal/alloy matrix results in a composite that undergoes local shear deformation upon rolling. Examples of rigid particles include $Al_2O_3$, $CeO_2$, YSZ, $Y_2O_3$, MgO, and other oxides, nitrides, carbides. Examples of soft ductile metal/alloy matrices include Ni, Cu, Al, Fe, and alloys based thereon.

EXAMPLE I

A 1" wide, 0.5" thick, 6" long copper bar containing 15 wt % $Al_2O_3$ in the form of submicron particles was rolled into a biaxially textured tape 50 $\mu$m thick and about 1" wide by hand rolling using reduced lubrication and high tension as described above and under the following conditions.

Figure 5A:
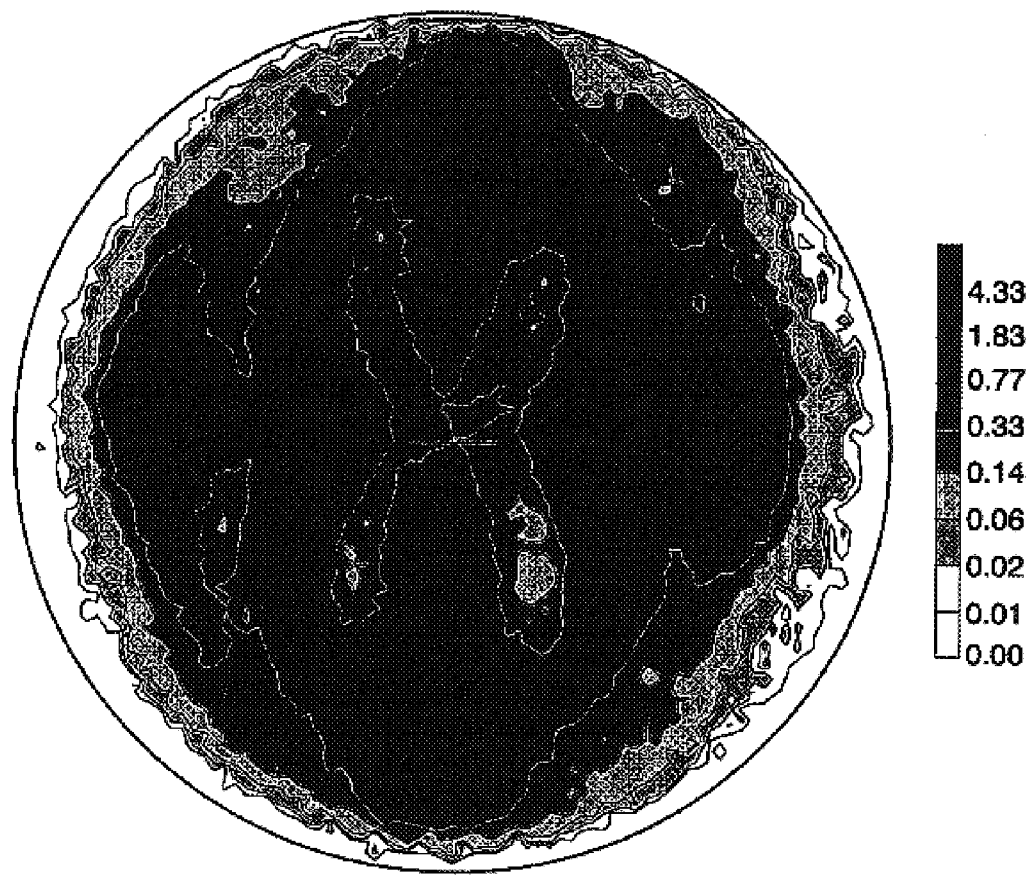
FIG. 5a is a log-scale (111) pole figure of as-rolled Cu in accordance with the present invention.
Figure 5B:
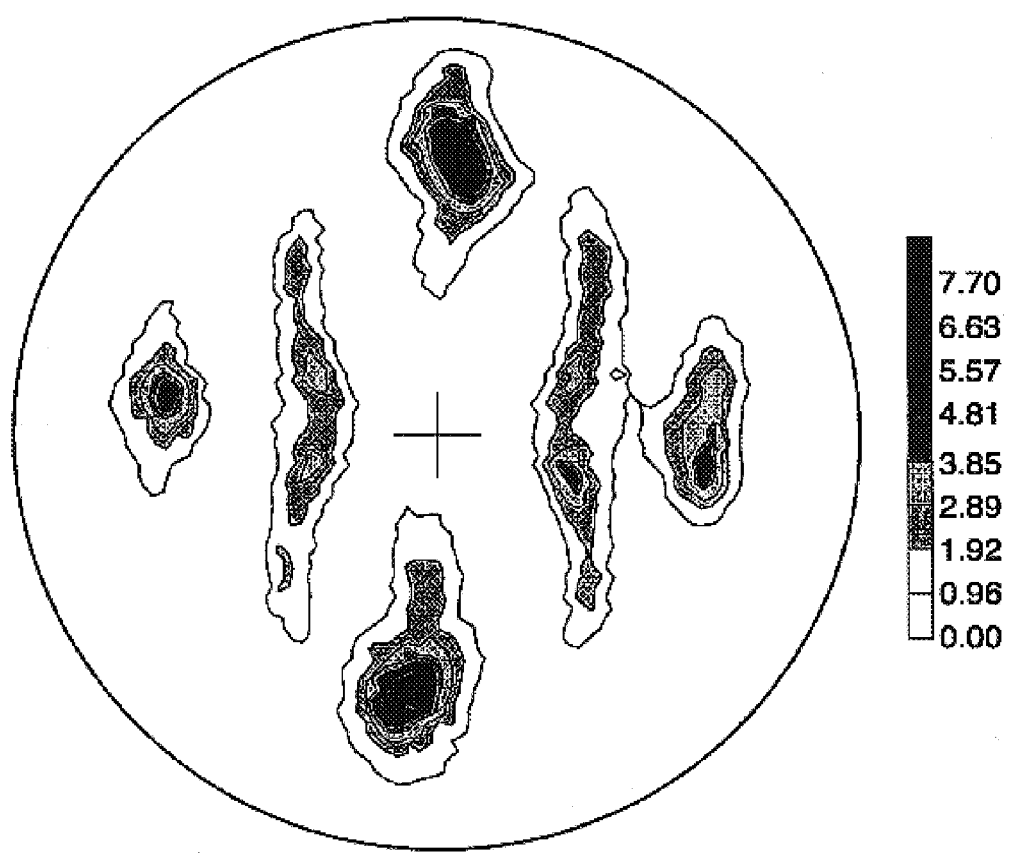
FIG. 5b is a linear-scale (111) pole figure of as-rolled Cu in accordance with the present invention.
Figure 6A:
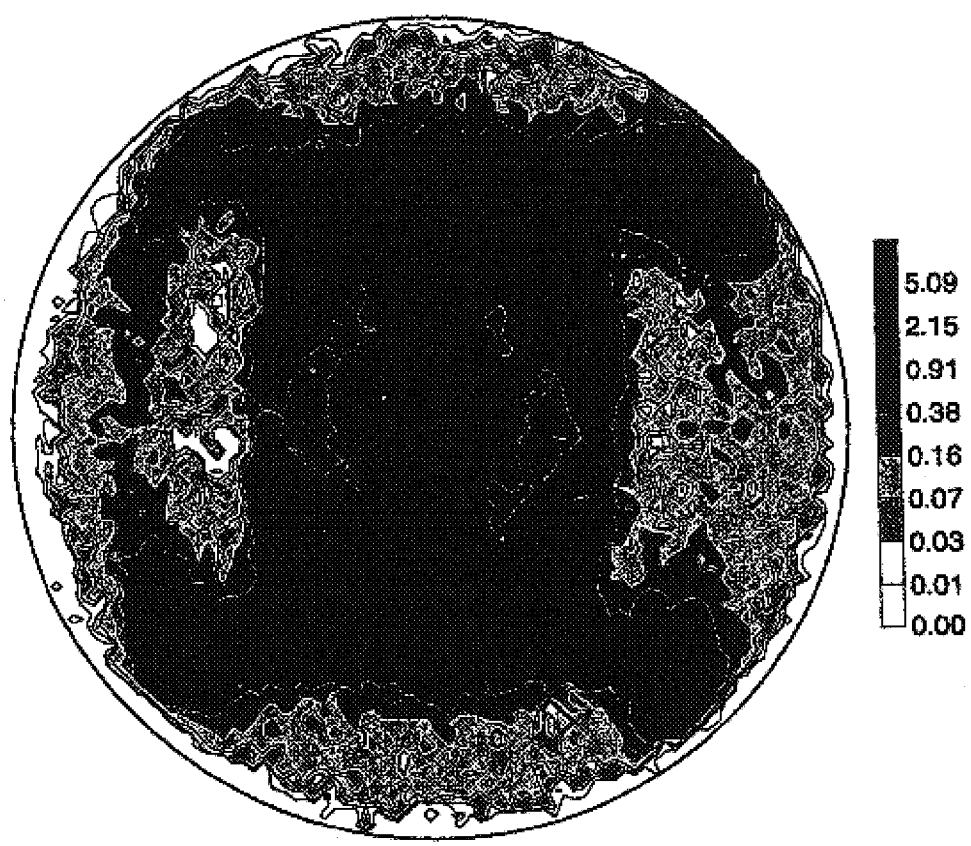
FIG. 6a is a log-scale (200) pole figure of as-rolled Cu in accordance with the present invention.
Figure 6B:
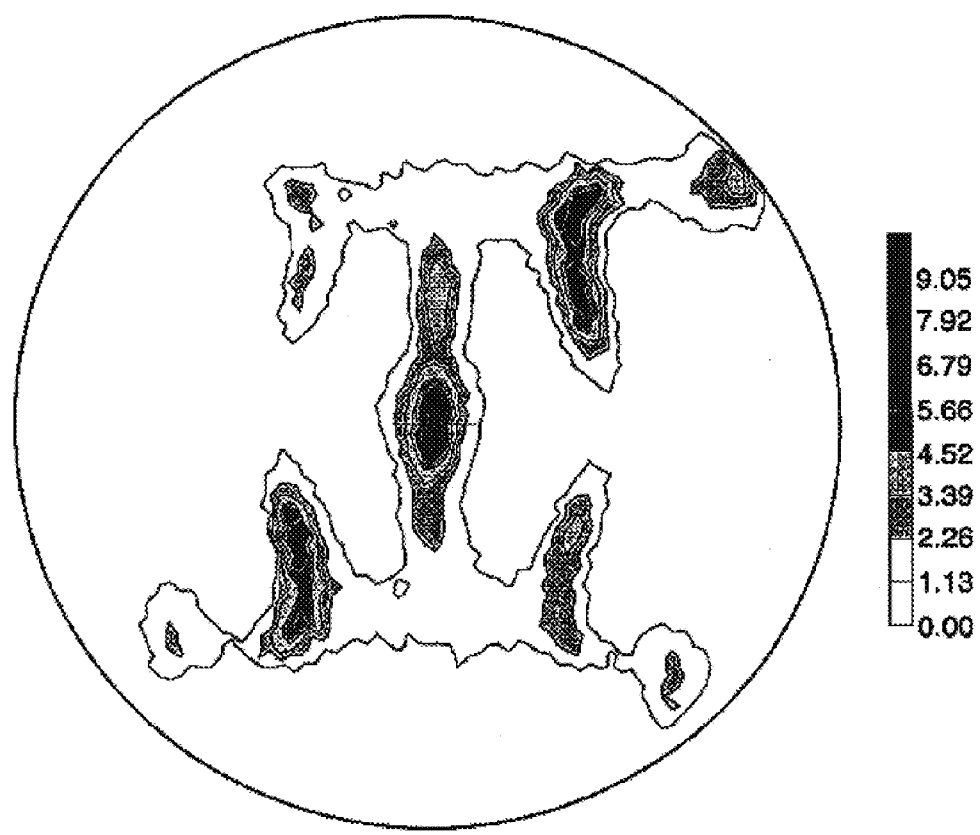
FIG. 6b is a linear-scale (200) pole figure of as-rolled Cu in accordance with the present invention.
Figure 7A:
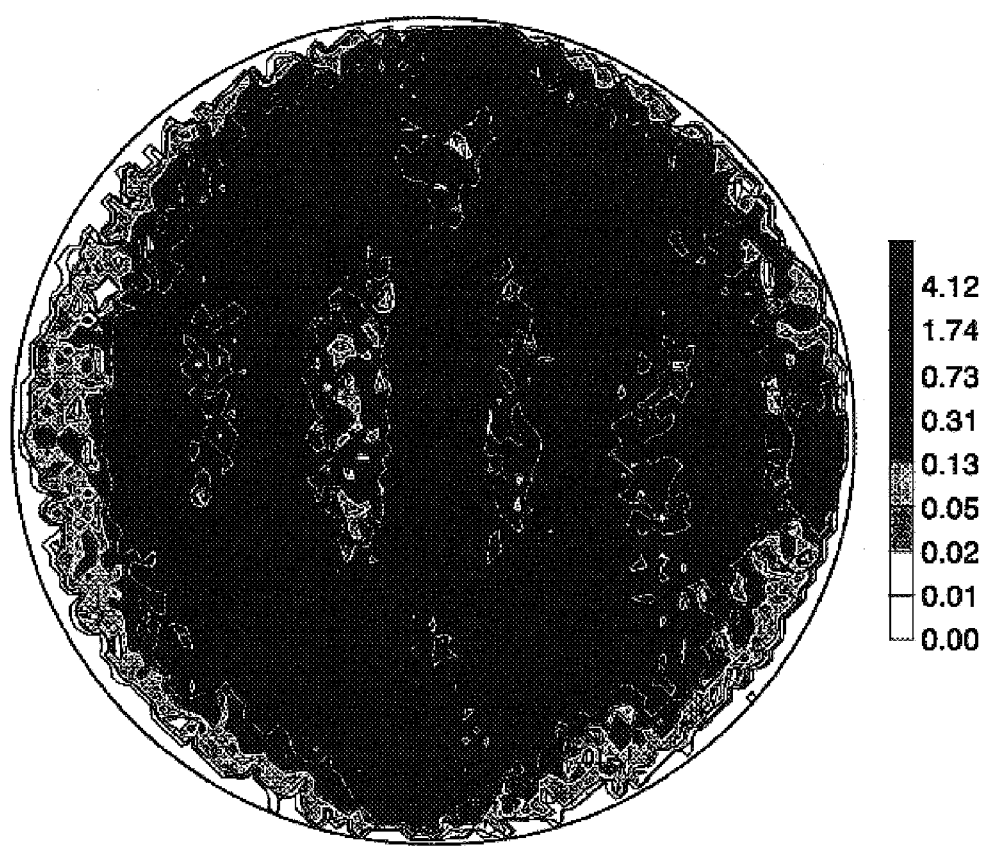
FIG. 7a is a log-scale (220) pole figure of as-rolled Cu in accordance with the present invention.
Figure 7B:
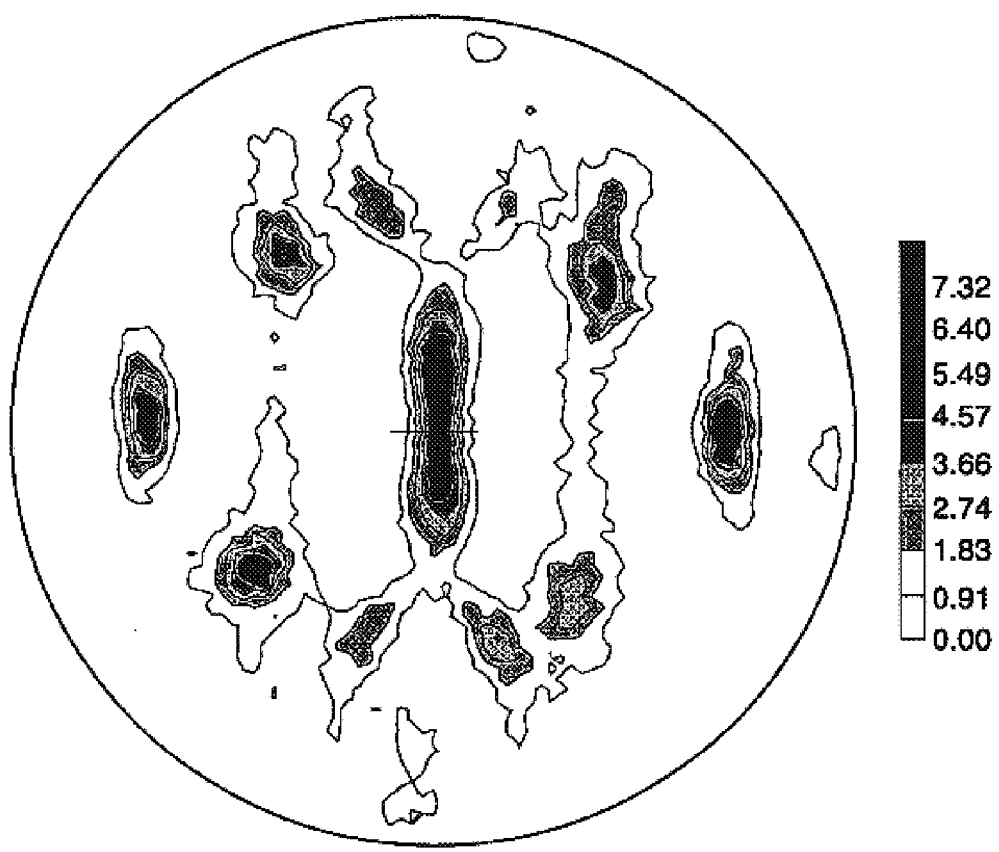
FIG. 7b is a linear-scale (220) pole figure of as-rolled Cu in accordance with the present invention.
Figure 8:
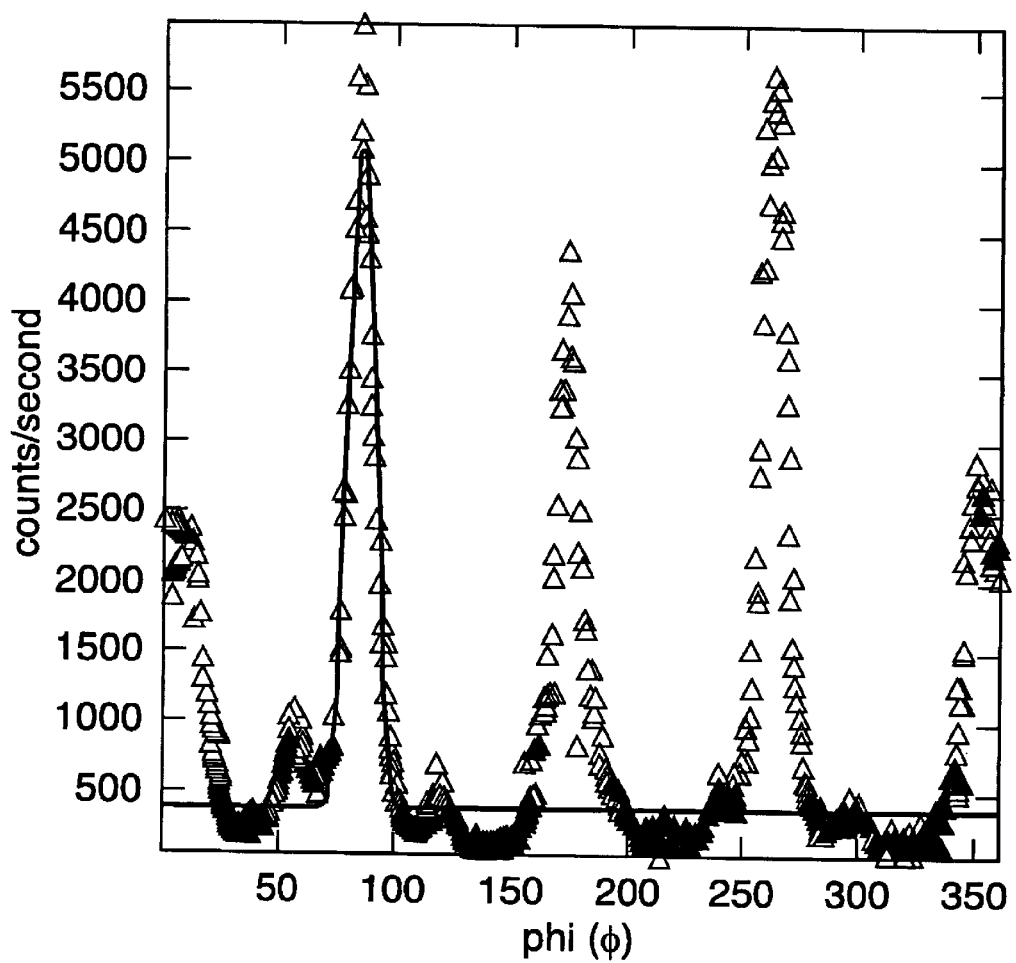
FIG. 8 is a (111) phi-scan of as-rolled Cu in accordance with the present invention.
Figure 9:
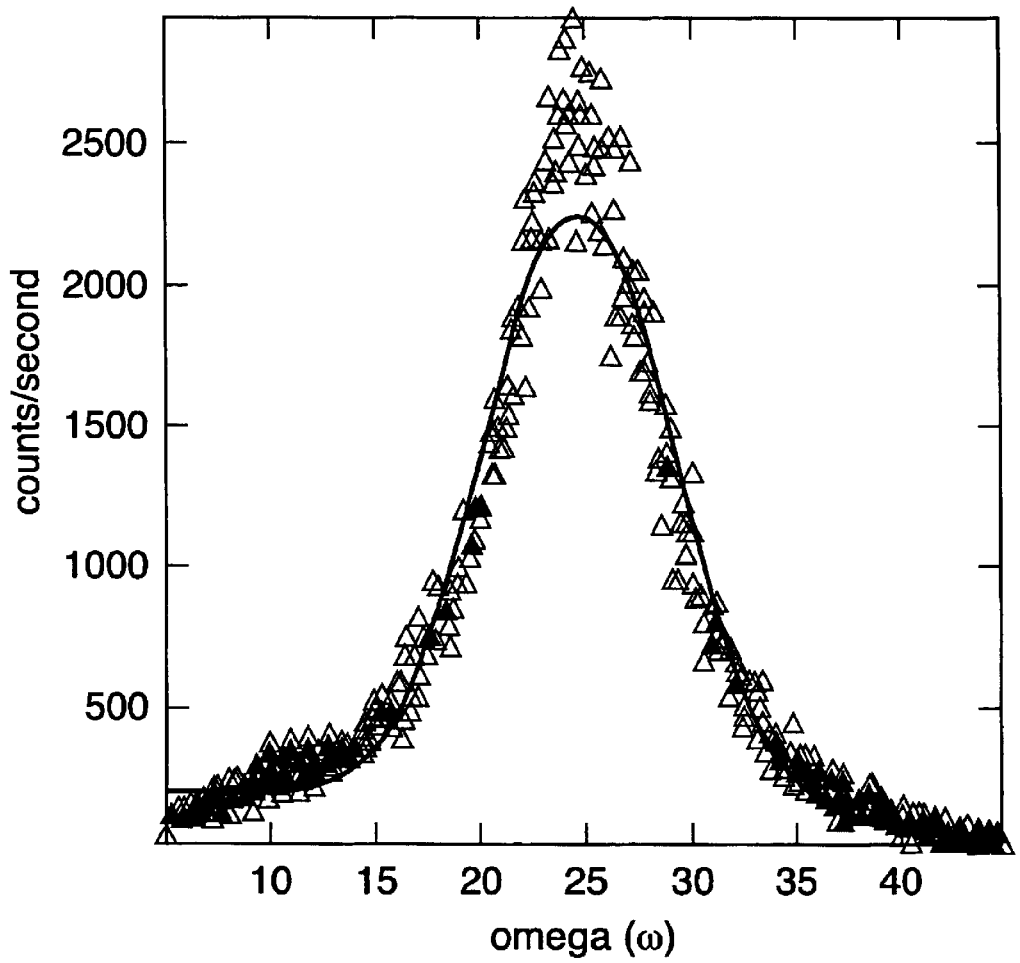
FIG. 9 is a (111) omega-scan of as-rolled Cu in accordance with the present invention.

Rolling temperature: Room temperature
Rolling speed: 15 ft./hr.
Reduction Per Pass: 10%
Rolling direction: Reverse
Applied forward tension: High
Applied back tension: None
Lubrication: None
Purity of Cu—Oxygen-free FIGS. 5a and 5b show log-scale and linear-scale (111) pole figures of as-rolled Cu fabricated in accordance with Example I. FIGS. 6a and 6b show log-scale and linear-scale is (200) pole figures of the same material, confirming the presence of a strong (200) texture normal to the surface of the as-rolled tape. FIGS. 7a and 7b show log-scale and linear-scale (220) pole figure of the same material. FIG. 8 is a (111) phi-scan of the tape showing the in-plane texture and FIG. 9 is an omega-scan showing the out-of-plane texture. These data clearly show the presence of a biaxially textured, 45°-rotated cube texture in the material.

Figure 10A:
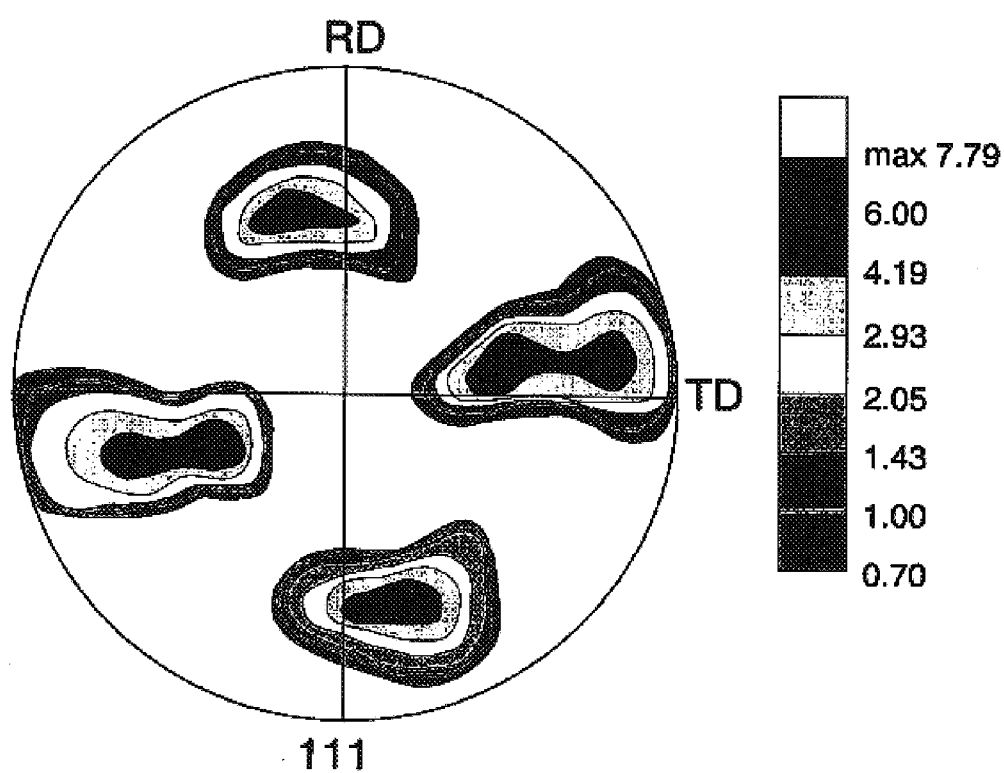
FIG. 10a is a (111) contour pole figure obtained by electron backscatter Kikuchi diffraction of the top surface of as-rolled Cu in accordance with the present invention.
Figure 10B:
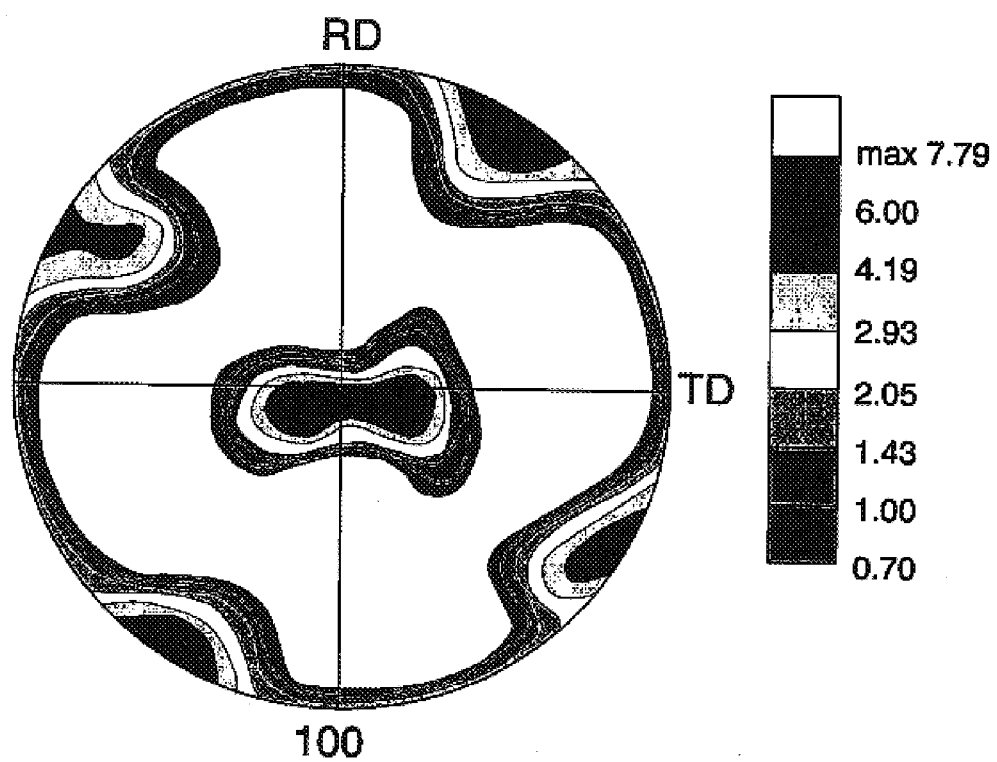
FIG. 10b is a (100) contour pole figure obtained by electron backscatter Kikuchi diffraction of the top surface of as-rolled Cu in accordance with the present invention.
Figure 10C:
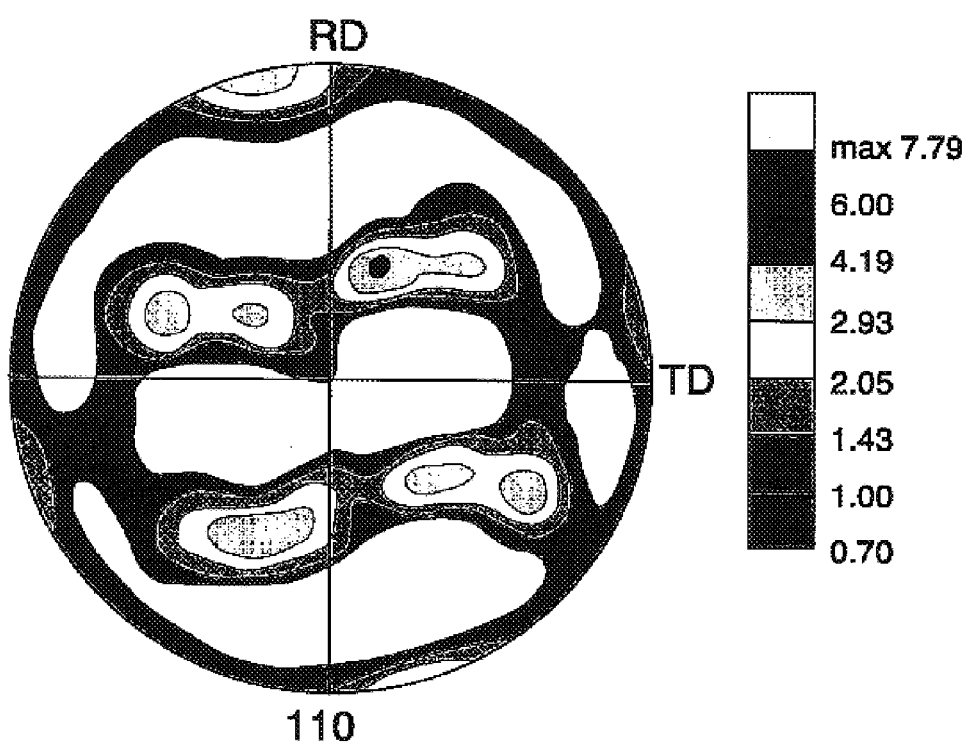
FIG. 10c is a (110) contour pole figure obtained by electron backscatter Kikuchi diffraction of the top surface of as-rolled Cu in accordance with the present invention.

FIGS. 10a, 10b, and 10c are, respectively, (111), (100), and (110) electron backscatter Kickuchi diffraction pole figures of the top surface of the tape. Clearly a clean, 45°-rotated cube texture in the material is seen at the top surface. The additional peaks in the pole figures are attributable to the material in the interior of the tape.

Figure 11:
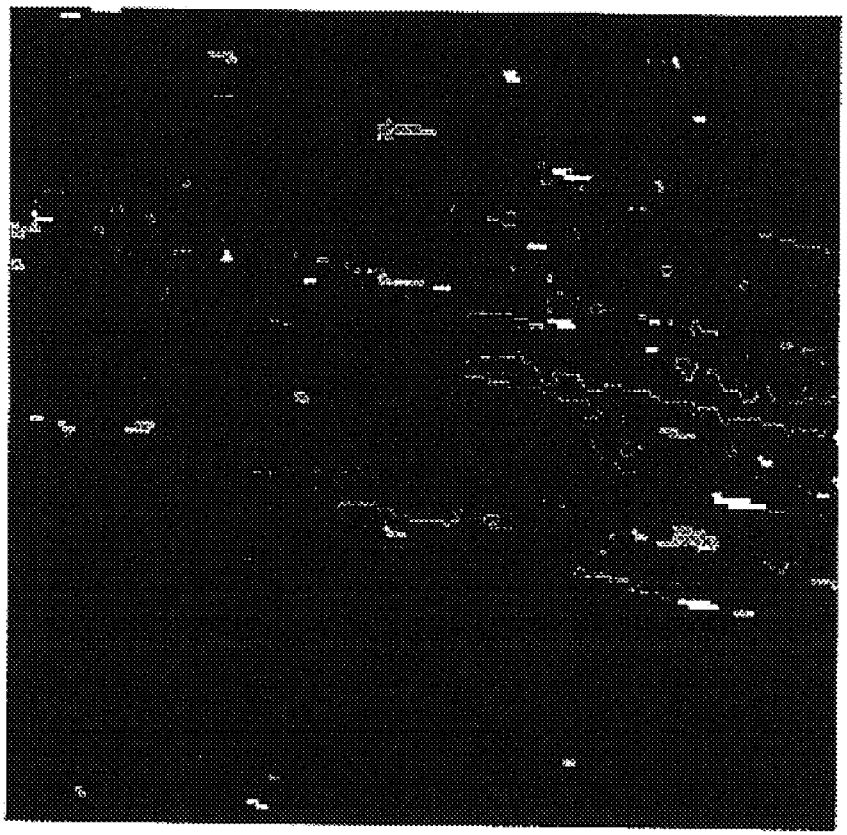
FIG. 11 is an image created by electron backscatter Kikuchi diffraction of the top surface of as-rolled Cu in accordance with the present invention.

FIG. 11 shows the microstructure of the same region from which the data for FIGS. 10a, 10b, and 10c were taken. Different shades of gray represent single grains. A grain is defined as a percolatively connected region within 3 degrees. FIG. 11 shows that the grains at the surface of the tape are elongated and form a "brick-floor" microstructure which is advantageous for supporting high-quality electromagnetic and electro-optical devices, especially high-temperature superconductors.

A "brick-floor" microstructure is defined as follows: The surface of the tape has aspected (elongated) grains having an aspect ratios of at least 10 in the plane of the substrate and having at least one crystallographic direction in the grains aligned. The aspect ratio is defined as the ratio of the length of the grain divided by the width of the grain in the plane of the substrate. With respect to texture, in cases where only one crystallographic axis is preferentially aligned (uniaxial texture), then the aligned axis is the crystallographic normal or perpendicular to the plane of the tape. In cases where two axes are aligned (biaxial texture), both the axis perpendicular to the tape and an axis in the plane are aligned. In the present invention, a unique and distinct brick floor microstructure with a rotated uniaxial and/or biaxial texture is attainable.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A biaxially textured article comprising a rolled, biaxially textured metallic substrate characterized by a rotated cube texture wherein a (100) cube face thereof is parallel to a surface of said article, and wherein a [100] direction thereof is at an angle of at least 10° relative to a rolling direction thereof, said substrate having thereon at least one epitaxial layer of another material.

2. An article in accordance with claim 1, wherein said [100] direction is at an angle of at least 30° relative to the rolling direction.

3. An article in accordance with claim 2, wherein said [100] direction is at an angle of about 45° relative to the rolling direction.

4. An article in accordance with claim 1, wherein said substrate is further characterized by an x-ray diffraction phi scan peak of no more than 20° FWHM.

5. An article in accordance with claim 1, wherein said substrate further comprises grains having an average size of no more than 10 µm.

6. An article in accordance with claim 5, wherein said substrate further comprises grains having an average size of no more than 5 µm.

7. An article in accordance with claim 6, wherein said substrate further comprises grains having an average size of no more than 1 µm.

8. An article in accordance with claim 1, wherein said substrate further comprises grains having an aspect ratio of at least 10.

9. An article in accordance with claim 1, wherein said substrate is further characterized by a brick-floor microstructure.

10. An article in accordance with claim 1 wherein said another material comprises at least one of the group consisting of electromagnetic devices and electro-optical devices.

11. An article in accordance with claim 10, wherein said device further comprises a superconducting material.

12. An article in accordance with claim 10, wherein said device further comprises a ferroelectric material.

13. A biaxially textured article comprising a biaxially textured metallic substrate having a microstructure characterized by a {100}<100> crystalline structure orientation which is at an angle of at least 10° relative to an ideal cube texture orientation of {100}<100>, said substrate having thereon at least one epitaxial layer of another material.

14. An article in accordance with claim 13, wherein said {100}<100> orientation is at an angle of at least 30° to the ideal cube texture orientation.

15. An article in accordance with claim 14, wherein said {100}<100> orientation is at an angle of about 45° relative to the ideal cube texture orientation.

16. An article in accordance with claim 13, wherein said substrate is further characterized by an x-ray diffraction phi scan peak of no more than 20° FWHM.

17. An article in accordance with claim 13, wherein said substrate further comprises grains having an average size of no more than 10 µm.

18. An article in accordance with claim 17, wherein said substrate further comprises grains having an average size of no more than 5 µm.

19. An article in accordance with claim 18, wherein said substrate further comprises grains having an average size of no more than 1 µm.

20. An article in accordance with claim 13, wherein said substrate further comprises grains having an aspect ratio of at least 10.

21. An article in accordance with claim 13, wherein said substrate is further characterized by a brick-floor microstructure.

22. An article in accordance with claim 13 wherein said another material comprises at least one of the group consisting of electromagnetic devices and electro-optical devices.

23. An article in accordance with claim 22, wherein said device further comprises a superconducting material.

24. An article in accordance with claim 23, wherein said device further comprises a ferroelectric material.

25. A textured article comprising a textured metallic substrate characterized by a rotated cube texture, said substrate being further characterized by a brick-floor microstructure, said substrate having thereon at least one epitaxial layer of another material.

26. An article in accordance with claim 25, wherein said substrate is biaxially textured and is characterized by a x-ray diffraction phi scan peak of no more than 20° FWHM.

27. An article in accordance with claim 25, wherein said substrate comprises grains having an aspect ratio of at least 10.

28. An article in accordance with claim 25 wherein said another material comprises at least one of the group consisting of electromagnetic devices and electro-optical devices.

29. An article in accordance with claim 28, wherein said device comprises a superconducting material.

30. An article in accordance with claim 28, wherein said device comprises a ferroelectric material.

31. A method of preparing a biaxially textured article comprising the steps of:

a. rolling a metal preform while applying shear force thereto to form as-rolled biaxially textured substrate having an a rotated cube texture wherein a (100) cube face thereof is parallel to a surface of said substrate, and wherein a [100] direction thereof is at an angle of at least 10° relative to the rolling direction;

b. depositing onto said surface of said biaxially textured substrate at least one epitaxial layer of another material to form a biaxially textured article.

32. A method in accordance with claim 31, wherein said [100] direction is at an angle of at least 30° to the rolling direction.

33. A method in accordance with claim 32, wherein said [100] direction is at an angle of about 45° to the rolling direction.

34. A method in accordance with claim 31, wherein said as-rolled substrate is further characterized by an x-ray diffraction phi scan peak of no more than 20° FWHM.

35. A method in accordance with claim 31, wherein said as-rolled substrate further comprises grains having an average size of no more than 10 µm.

36. A method in accordance with claim 35, wherein said as-rolled substrate further comprises grains having an average size of no more than 5 µm.

37. A method in accordance with claim 36, wherein said as-rolled substrate further comprises grains having an average size of no more than 1 µm.

38. A method in accordance with claim 31, wherein said as-rolled substrate further comprises grains having an aspect ratio of at least 10.

39. A method in accordance with claim 31 wherein said another material comprises at least one of the group consisting of electromagnetic devices and electro-optical devices.

40. A method in accordance with claim 39, wherein said device further comprises a superconducting material.

41. A method in accordance with claim 39, wherein said device comprises a ferroelectric material.

* * * * *